United States Patent
Rubin et al.

(10) Patent No.: US 10,714,420 B1
(45) Date of Patent: Jul. 14, 2020

(54) HIGH CUTOFF FREQUENCY METAL-INSULATOR-METAL CAPACITORS IMPLEMENTED USING VIA CONTACT CONFIGURATIONS

(71) Applicant: International Business Machines Corporation, Armonk, NY (US)

(72) Inventors: Joshua M. Rubin, Albany, NY (US); Joel A. Silberman, Somers, NY (US); Robert Groves, Highland, NY (US)

(73) Assignee: International Business Machines Corporation, Armonk, NY (US)

(*) Notice: Subject to any disclaimer, the term of this patent is extended or adjusted under 35 U.S.C. 154(b) by 4 days.

(21) Appl. No.: 16/237,958

(22) Filed: Jan. 2, 2019

(51) Int. Cl.
*H01L 21/02* (2006.01)
*H01L 23/522* (2006.01)
(Continued)

(52) U.S. Cl.
CPC .... *H01L 23/5223* (2013.01); *H01L 21/76802* (2013.01); *H01L 21/76877* (2013.01);
(Continued)

(58) Field of Classification Search
USPC .......... 257/532, 210–211, 503, 508, 257/E33.062–E33.066, E31.124–E31.126,
(Continued)

(56) References Cited

U.S. PATENT DOCUMENTS 7,968,375 B1  6/2011  Rahman et al.
8,952,748 B2  2/2015  Guimaraes et al.
(Continued)

FOREIGN PATENT DOCUMENTS

WO  2008010028 A1  1/2008

OTHER PUBLICATIONS

X. Zeng et al., "The Reliability Study of MIM Capacitor Built on Top of Backside Via in III-V Compound MMIC," CS MANTECH Conference, Apr. 24-27, 2006, pp. 87-90.
(Continued)

*Primary Examiner* — Niki H Nguyen
(74) *Attorney, Agent, or Firm* — Vazken Alexanian; Ryan, Mason & Lewis, LLP

(57) ABSTRACT

Devices and methods are provided for fabricating a metal-insulator-metal capacitor within an interconnect structure (e.g., back-end-of-line interconnect structure) to provide capacitive decoupling between positive and negative power supply voltage lines of a power distribution network. Various via contact configurations including interlevel via contacts and truncated via contacts are utilized to connect the metal-insulator-metal capacitor electrodes to power supply voltage lines of the power distribution network to provide an array of high-density, low resistance via contact connections at various locations across the capacitor electrodes to reduce the resistance of the metal-insulator-metal capacitor and, thus, enhance the transient response time and increase the cutoff frequency of the metal-insulator-metal capacitor. The truncated via contacts allow for higher density via contact connections to the capacitor electrodes in regions which have a dense array of wiring of a single polarity, where interlevel via contacts cannot be utilized to provide contacts to the capacitor electrodes.

20 Claims, 10 Drawing Sheets

(51) Int. Cl.
  *H01L 23/528* (2006.01)
  *H01L 21/768* (2006.01)
  *H01L 49/02* (2006.01)
  *H01L 23/66* (2006.01)

(52) U.S. Cl.
  CPC ...... *H01L 23/5226* (2013.01); *H01L 23/5286* (2013.01); *H01L 23/66* (2013.01); *H01L 28/60* (2013.01); *H01L 2223/6666* (2013.01)

(58) Field of Classification Search
  USPC ............ 257/E51.019; 438/98, 100, 584–688
  See application file for complete search history.

(56) References Cited

U.S. PATENT DOCUMENTS

| | | |
|---|---|---|
| 9,029,983 B2 | 5/2015 | Chen et al. |
| 2009/0200638 A1* | 8/2009 | Smith ............... H01L 21/76816 257/532 |
| 2014/0103489 A1* | 4/2014 | Dirnecker ............... H01L 28/24 257/532 |
| 2015/0295020 A1* | 10/2015 | Tseng ................... H01L 23/481 257/532 |
| 2017/0194246 A1 | 7/2017 | Detalle et al. |
| 2018/0108651 A1 | 4/2018 | Kannan et al. |

OTHER PUBLICATIONS

S.R. Ekanayake et al., "Metal-Insulator-Metal (MIM) Nanocapacitors and Effects of Material Properties on Their Operation," Institute of Materials Engineering Australasia Ltd., Materials Forum, 2004, pp. 15-20, vol. 27.

* cited by examiner

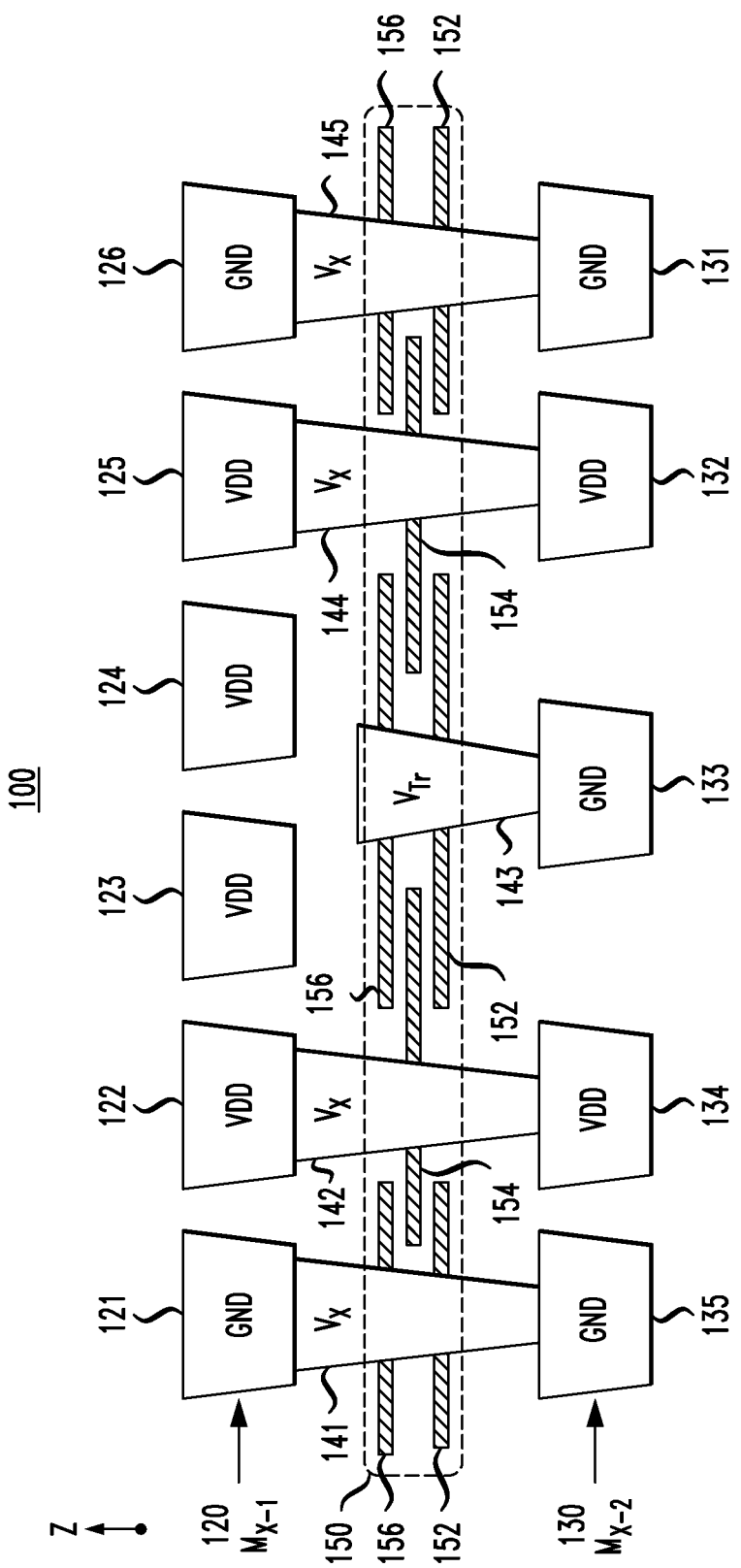

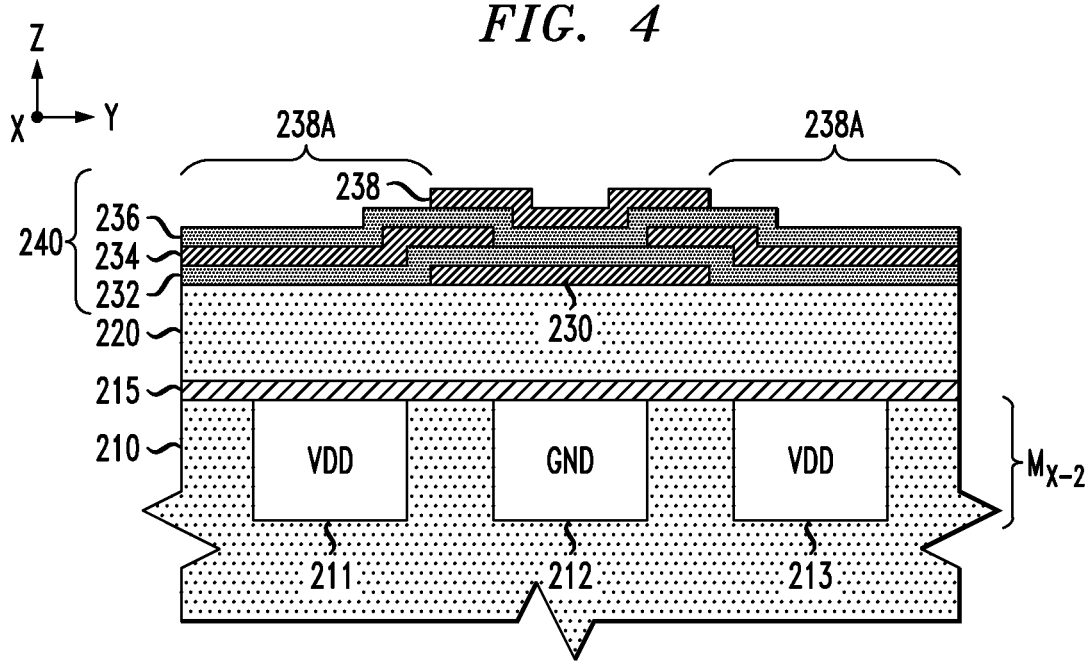
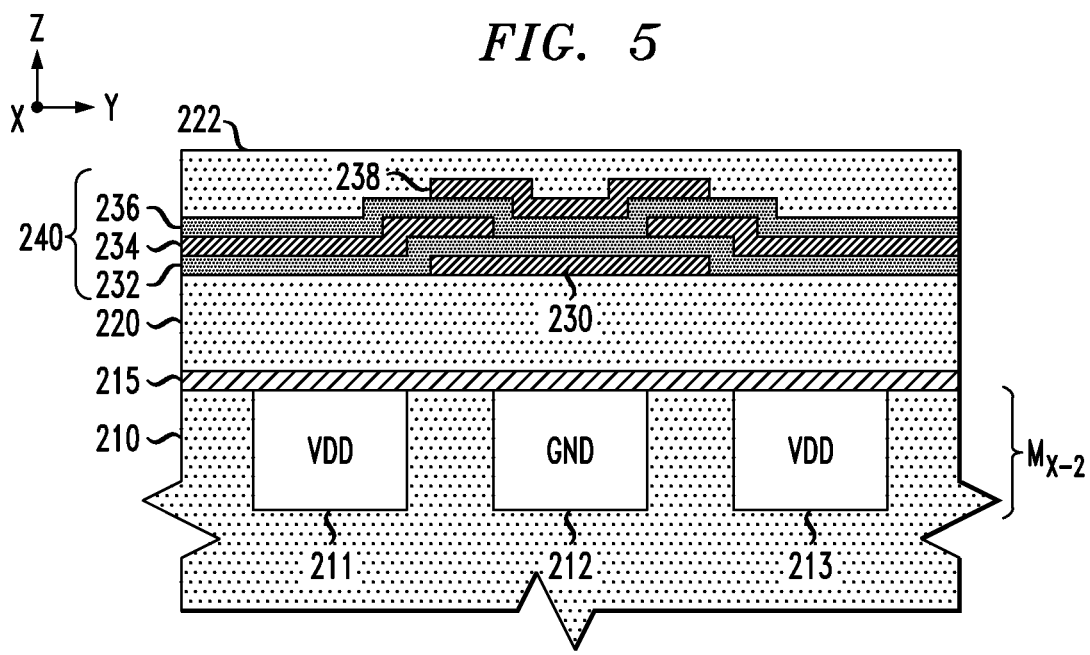

600

US 10,714,420 B1

HIGH CUTOFF FREQUENCY METAL-INSULATOR-METAL CAPACITORS IMPLEMENTED USING VIA CONTACT CONFIGURATIONS

TECHNICAL FIELD

This disclosure relates generally to semiconductor fabrication techniques and, in particular, to techniques for fabricating metal-insulator-metal (MIM) capacitors.

BACKGROUND

In semiconductor device manufacturing, capacitors are passive circuit components that are utilized in integrated circuitry of a semiconductor chip for various purposes. For example, capacitors can be utilized to decouple power supplies, to form memory elements, to form RC delay circuits, or provide various other circuit functions. While many types of capacitor structures can be utilized, MIM capacitors are commonly used for analog, microwave, and radio frequency (RF) applications. In general, planar MIM capacitors are comprised of two metallic plates separated by an insulator layer. As is known in the art, the capacitance of an MIM capacitor is (i) directly proportional to a surface area of the overlapping metallic plates, (ii) directly proportional to a dielectric constant of the dielectric material of the capacitor insulator layer, and (iii) inversely proportional to a thickness of the capacitor insulator layer.

MIM capacitors with high cutoff frequency are desired for decoupling of power supplies with mid and high-frequency noise. In particular, high-performance circuits typically require high-value, low-impedance decoupling capacitors between direct current (DC) power supply lines and ground metal lines to limit noise created by rapid switching of current within an integrated circuit, and to prevent voltage drops that occur when MIM capacitors have low transient response times, e.g., $\tau = R \times C$ (e.g., low cut-off frequencies) and cannot supply the proper charge in response to the rapid switching of current within the integrated circuit. When the voltage drop is significant, the integrated circuitry will not function properly.

SUMMARY

Embodiments of the invention include devices and methods for fabricating metal-insulator-metal capacitor structures that are integrated within interconnect structures (e.g., back-end-of-line interconnect structures) to provide capacitive decoupling between positive and negative power supply lines of a power distribution network.

For example, in one embodiment, a device comprises: an interconnect structure comprising a first metallization level and a second metallization level, wherein the first and second metallization levels comprise metal lines which form wiring of a power distribution network for distributing power supply voltage of a first polarity and power supply voltage of a second polarity, wherein the second metallization level comprises a dense region of metal lines to distribute power supply voltage of the first polarity; a metal-insulator-metal capacitor disposed between the first and second metallization levels, wherein the metal-insulator-metal capacitor comprises a first capacitor electrode, a second capacitor electrode, and a first capacitor dielectric layer disposed between the first and second capacitor electrodes; a first interlevel via contact which connects a metal line of the first metallization level with a metal line of the second metallization level to distribute power supply voltage of the first polarity between the first and second metallization levels; wherein the first interlevel via contact penetrates through the second capacitor electrode with the second capacitor electrode in contact with sidewalls of the first interlevel via contact to distribute power supply voltage of the first polarity to the second capacitor electrode; and a first truncated via contact which connects a metal line of the first metallization level to the first capacitor electrode in a location of the metal-insulator-metal capacitor which is overlapped by the dense region of metal lines of the second metallization level; wherein the first truncated via contact distributes power supply voltage of the second polarity to the first capacitor electrode.

In another embodiment, a method comprises: forming an interconnect structure comprising a first metallization level and a second metallization level, wherein the first and second metallization levels comprise metal lines which form wiring of a power distribution network for distributing power supply voltage of a first polarity and power supply voltage of a second polarity, wherein the second metallization level comprises a dense region of metal lines to distribute power supply voltage of the first polarity; forming a metal-insulator-metal capacitor between the first and second metallization levels, wherein the metal-insulator-metal capacitor comprises a first capacitor electrode, a second capacitor electrode, and a first capacitor dielectric layer disposed between the first and second capacitor electrodes; forming a first interlevel via contact to connect a metal line of the first metallization level with a metal line of the second metallization level to distribute power supply voltage of the first polarity between the first and second metallization levels; wherein the first interlevel via contact penetrates through the second capacitor electrode with the second capacitor electrode in contact with sidewalls of the first interlevel via contact to distribute power supply voltage of the first polarity to the second capacitor electrode; and forming a first truncated via contact to connect a metal line of the first metallization level to the first capacitor electrode in a location of the metal-insulator-metal capacitor which is overlapped by the dense region of metal lines of the second metallization level; wherein the first truncated via contact distributes power supply voltage of the second polarity to the first capacitor electrode.

In another embodiment, a device comprises: an interconnect structure comprising a first metallization level and a second metallization level, wherein the first and second metallization levels comprise metal lines which form wiring of a power distribution network for distributing power supply voltage of a first polarity and power supply voltage of a second polarity, wherein the second metallization level comprises a dense region of metal lines to distribute power supply voltage of the first polarity; a metal-insulator-metal capacitor disposed between the first and second metallization levels, wherein the metal-insulator-metal capacitor comprises a first capacitor electrode, a second capacitor electrode, and a first capacitor dielectric layer disposed between the first and second capacitor electrodes; a plurality of first interlevel via contacts which connect metal lines of the first metallization level with metal lines of the second metallization level to distribute power supply voltage of the first polarity between the first and second metallization levels; wherein the plurality of first interlevel via contacts penetrate through the second capacitor electrode at different locations of the second capacitor electrode with the second capacitor electrode in contact with sidewalls of the first interlevel via contacts to distribute power supply voltage of the first polarity across the second capacitor electrode; a plurality of second interlevel via contacts which connect metal lines of the first metallization level with metal lines of the second metallization level to distribute power supply voltage of the second polarity between the first and second metallization levels; wherein the plurality of second interlevel via contacts penetrate through the first capacitor electrode at different locations of the first capacitor electrode with the first capacitor electrode in contact with sidewalls of the second interlevel via contacts to distribute power supply voltage of the second polarity across the first capacitor electrode; and a plurality of first truncated via contacts which connect metal lines of the first metallization level to the first capacitor electrode at different locations of the first capacitor electrode which are overlapped by the dense region of metal lines of the second metallization level; wherein the first truncated via contacts distribute power supply voltage of the second polarity across the first capacitor electrode.

Other embodiments will be described in the following detailed description of embodiments, which is to be read in conjunction with the accompanying figures.

BRIEF DESCRIPTION OF THE DRAWINGS

FIG. 1B is a schematic cross-sectional side view of the BEOL interconnect structure of FIG. 1A along line 1B-1B shown in FIG. 1A.

FIGS. 2-8 schematically illustrate a method for fabricating an MIM capacitor to provide capacitive decoupling between positive and negative power supply lines of a power distribution network within a BEOL interconnect structure, according to an embodiment of the invention, wherein:

FIG. 2 is a schematic cross-sectional side view of a BEOL interconnect structure at an intermediate stage of fabrication which comprises a first interlayer dielectric (ILD) layer, power distribution lines formed in the first ILD layer, a dielectric capping layer formed on the first ILD insulating layer, a first insulating layer formed on the capping layer, and a first capacitor electrode formed on the first insulating layer;

FIG. 3 is a schematic cross-sectional side view of the BEOL interconnect structure shown in FIG. 2 after depositing a first high-k dielectric film over the first capacitor electrode and after depositing and patterning a layer of metallic material over the first high-k dielectric film to form a second capacitor electrode;

FIG. 4 is a schematic cross-sectional side view of the BEOL interconnect structure shown in FIG. 3 after depositing a second high-k dielectric film over the second capacitor electrode and after depositing and patterning a layer of metallic material over the second high-k dielectric film to form a third capacitor electrode;

FIG. 5 is a schematic cross-sectional side view of the BEOL interconnect structure shown in FIG. 4 after forming a second insulating layer over the first insulating layer and the MIM capacitor;

FIG. 6 is a schematic cross-sectional side view of the BEOL interconnect structure shown in FIG. 5 after forming a truncated via contact to connect the first and third capacitor electrodes to a underlying GND metal line;

FIG. 7 is a schematic cross-sectional side view of the BEOL interconnect structure shown in FIG. 6 after forming a third insulating layer over the second insulating layer, and after forming interlevel via contacts to connect the second capacitor electrode to underlying VDD metal lines; and FIG. 8 is a schematic cross-sectional side view of the BEOL interconnect structure shown in FIG. 7 after forming a third ILD layer, forming power distribution lines in the third ILD layer, and after forming a capping layer over the third ILD layer.

DETAILED DESCRIPTION OF EMBODIMENTS

Figure 1A:
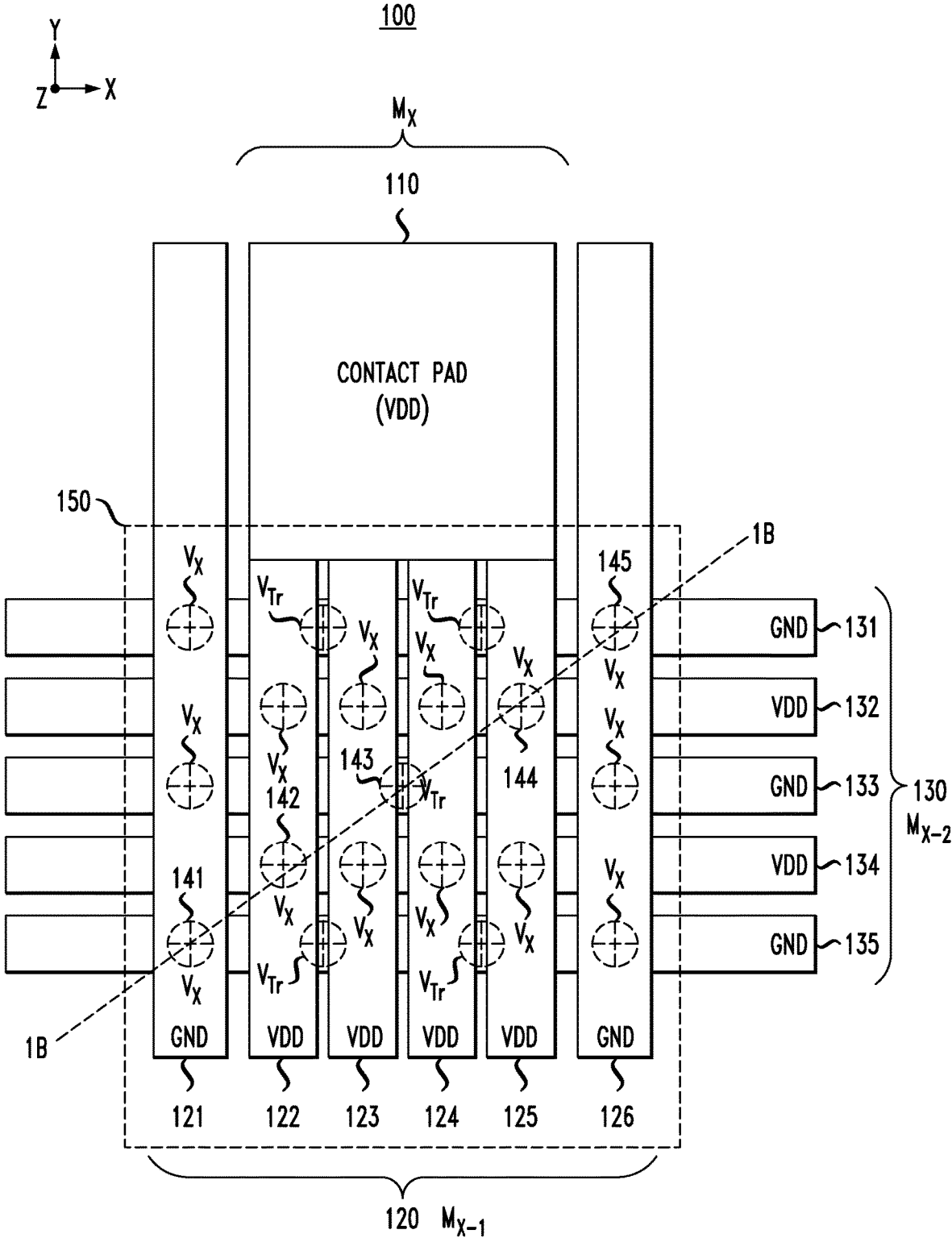
FIG. 1A schematically illustrates a back-end-of-line (BEOL) interconnect structure comprising a MIM capacitor to provide capacitive decoupling between positive and negative power supply lines of a power distribution network, according to an exemplary embodiment of the invention.

Embodiments will now be described in further detail with regard to methods for fabricating MIM capacitors with enhanced cutoff frequencies. For illustrative purposes, exemplary embodiments of the invention will be discussed in the context of forming decoupling MIM capacitors within a back-end-of-line (BEOL) interconnect layer to provide capacitive decoupling between positive power supply lines (e.g., VDD lines) and negative power supply lines (e.g., ground or VSS lines). As discussed in further detail below, MIM capacitor structures are fabricated using various types of via contact configurations within the BEOL interconnect structure to connect MIM capacitor electrodes (or capacitor plates) to metal lines which form wiring of a power distribution network for distributing power supply voltage of a first polarity (e.g., VDD) and power supply voltage of a second polarity (e.g., ground (GND) or VSS).

For example, such via contact configurations include (i) interlevel via contacts which provide vertical connections between metal lines of upper and lower metallization levels, wherein the interlevel via contacts penetrate through MIM capacitor electrodes to connect the capacitor electrodes to sidewalls of the interlevel via contacts and (ii) truncated via contacts which are utilized to connect MIM capacitor electrodes to metal lines of one metallization level in regions of a power distribution network where a metallization level comprises a dense region of metal lines to distribute power supply voltage of a single polarity. The truncated via contacts may comprise (i) "MIM-on-via contacts" in which MIM capacitor electrodes are formed on top of truncated via contacts, (ii) "via contact-on-MIM" contacts in which truncated via contacts are formed on top of MIM capacitor electrodes; (iii) truncated via contacts which penetrate through MIM capacitor electrodes to connect the capacitor electrodes to sidewalls of the truncated via contacts, and (iv) combinations of such truncated via contact configurations.

The combined interlevel and truncated via contact configurations allow for the fabrication of high-density, low resistance via contact connections at various locations across the capacitor electrodes of an MIM capacitor to reduce the resistance of the MIM capacitor and thus enhance the transient response time and increase the cutoff frequency of the MIM capacitor. As noted above, the transient response time of an MIM capacitor is τ=R×C (e.g., RC time constant) where R denotes a resistance of the MIM capacitor and C denotes a capacitance of the MIM capacitor. The combined interlevel and truncated via contact configurations allow for high density via connections between the power distribution lines and the MIM capacitor electrodes, which results in a reduction in the resistive component of MIM capacitor by a decreased spacing between the via contacts to the MIM capacitor electrodes. As explained in further detail below, the reduced spacing is achieved, in part, by the use of truncated via contacts to connect power distribution lines to the MIM capacitor electrodes in regions of the power distribution network where a dense array of grid wiring of a single polarity (e.g., VDD lines) is present to efficiently distribute current with minimal IR drop and provide EM protection. The truncated via contacts allow for higher density via contact connections to the MIM capacitor electrodes in regions of dense wiring of a single polarity, where interlevel via contacts cannot be utilized to provide contacts to the MIM capacitor electrodes.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. To provide spatial context, XYZ Cartesian coordinates are shown in the drawings of semiconductor device structures. It is to be understood that the term "vertical" as used herein denotes a Z-direction of the Cartesian coordinates shown in the drawings, and that the terms "horizontal" or "lateral" as used herein denote an X-direction and/or a Y-direction of the Cartesian coordinates shown in the drawings, which is perpendicular to the Z-direction.

FIGS. 1A and 1B schematically illustrate a BEOL interconnect layer 100 comprising a MIM capacitor structure to provide capacitive decoupling between positive and negative power supply lines of a power distribution network, according to an exemplary embodiment of the invention. In particular, FIG. 1A is a schematic top plan view of the BEOL interconnect structure 100, and FIG. 1B is a schematic cross-sectional side view of the BEOL interconnect structure 100 along line 1B-1B shown in FIG. 1A. As shown in FIGS. 1A and 1B, the BEOL interconnect structure 100 comprises an upper metallization level $M_X$ comprising a contact pad 110 (e.g., C4 solder bump pad), a metallization level $M_{X-1}$ comprising a plurality of power distribution lines 120 which extend in a Y-direction), and a metallization level $M_{X-2}$ comprising a plurality of power distribution lines 130 which extend in an X direction. The top-most metallization levels $M_{X-1}$ and $M_{X-2}$ are designed to be relatively thick and wide, with coarse pitch metal lines such that the power distribution lines 120 and 130 (and clock signal lines) have the least resistance and smallest RC time delay, which is desired for power distribution (and clock distribution).

For ease of illustration, one contact pad 110 of the upper metallization level $M_X$ is shown in FIG. 1A, wherein the contact pad 110 serves as a positive supply voltage (e.g., VDD) input pin for an integrated circuit chip comprising the BEOL interconnect structure 100. As is understood by one of ordinary skill in the art, the upper metallization level $M_X$ would have an array of contact pads including a plurality of positive supply voltage contact pads, negative supply voltage (e.g., ground) contact pads, signal input/output contact pads, etc., which are interspersed within the array of contact pads.

The power distribution lines 120 are formed as part of the next lower metallization level $M_{X-1}$ below the top-most metallization level $M_X$. The power distribution lines 120 comprise a plurality of parallel metal lines 121, 122, 123, 124, 125, and 126. In the exemplary embodiment of FIGS. 1A and 1B, the metal lines 122, 123, 124 and 125 extend below the contact pad 110 and are connected to the contact pad 110 through vertical via contacts (not specifically shown). As such, the metal lines 122, 123, 124 and 125 provide an array of coarse grid wiring to distribute positive power supply voltage (e.g., VDD) which is applied to the contact pad 110. Further, in the exemplary embodiment of FIGS. 1A and 1B, the metal lines 121 and 126, which are disposed at the edges of the coarse grid wiring 122, 123, 124 and 125, are connected to ground contact pads (not shown) and serve to distribute negative supply voltage (e.g., ground (GND)) in the metallization level $M_{X-1}$.

The power distribution lines 130 are formed as part of the next lower metallization level $M_{X-2}$ below the metallization level $M_{X-1}$. The power distribution lines 130 comprise a plurality of parallel metal lines 131, 132, 133, 134 and 135, which extend below, and orthogonal to, the parallel metal lines 121, 122, 123, 124, 125, and 126 of the power distribution lines 120. In the exemplary embodiment of FIGS. 1A and 1B, the metal lines 131, 133, and 135 serve to distribute negative power supply voltage (e.g., GND voltage) in the metallization level $M_{X-2}$, and the metal lines 132 and 134 serve to distribute positive power supply voltage (e.g., VDD) in the metallization level $M_{X-2}$.

The BEOL interconnect structure 100 comprises a plurality of interlevel via contacts $V_X$ which provide vertical connections between the power distribution lines 120 of the metallization level $M_{X-1}$ and the power distribution lines 130 of the metallization level $M_{X-2}$. In particular, as shown in FIGS. 1A and 1B, the negative power supply voltage (e.g., GND) metal lines 121 and 126 of the metallization level $M_{X-1}$ are connected to the negative power supply voltage (e.g., GND) metal lines 131, 133, and 135 of the metallization level $M_{X-2}$ through a first set of interlevel via contacts $V_X$. Similarly, the positive power supply voltage (e.g., VDD) metal lines 122, 123, 124, and 125 of the metallization level $M_{X-1}$ are connected to the positive power supply voltage (e.g., VDD) metal lines 132 and 134 of the metallization level $M_{X-2}$ through a second set of interlevel via contacts $V_X$.

As shown in FIG. 1B, the BEOL interconnect structure 100 further comprises a MIM capacitor 150 integrally formed in a via level between the metallization level $M_{X-1}$ and the metallization level $M_{X-2}$. In the exemplary embodiment shown in FIG. 1B, the MIM capacitor 150 comprises a three-electrode MIM capacitor structure which includes a first capacitor electrode 152 (or bottom capacitor electrode), a second capacitor electrode 154 (or middle capacitor electrode), and a third capacitor electrode 156 (or top capacitor electrode). Although not specifically shown in FIG. 1B, the MIM capacitor 150 comprises a first layer of high-k dielectric material disposed between the bottom capacitor electrode 152 and the middle capacitor electrode 154, and a second layer of high-k dielectric material disposed between the middle capacitor electrode 154 and the top capacitor electrode 156. The via level between the metallization level $M_{X-1}$ and the metallization level $M_{X-2}$ further comprises layers of low-k dielectric material which form an interlayer dielectric (ILD) layer that encapsulates the MIM capacitor 150.

As further shown in FIG. 1B, the MIM capacitor 150 comprises a plurality of via contacts which connect to the capacitor electrodes 152, 154 and 156 at various locations including, for example, interlevel via contacts ($V_X$) 141, 142, 144, and 145 and a truncated via contact ($V_{Tr}$) 143. The interlevel via contacts 141, 142, 144, and 145 are constructed to provide vertical connections between the power distribution lines 120 of the metallization level $M_{X-1}$ and the power distribution lines 130 of the metallization level $M_{X-2}$, as well as penetrate the capacitor electrodes 152, 154 and 156 at various locations over the area of the MIM capacitor 150 to connect the capacitor electrodes 152, 154 and 156 to sidewalls of the interlevel via contacts 141, 142, 144, and 145. In this regard, the three-electrode MIM capacitor 150 essentially comprises two MIM capacitor structures that are connected in parallel.

In particular, as shown in FIG. 1B, the interlevel via contacts 141 and 145 are formed to penetrate through, and in contact with, the upper capacitor electrode 156 and the bottom capacitor electrode 152 to provide negative power supply voltage (e.g., GND) connections to the upper and lower capacitor electrodes 156 and 152. The middle capacitor electrode 154 is patterned to have open regions which allow the interlevel via contacts 141 and 145 for GND connections to pass through without contacting the middle capacitor electrode 154. In addition, the interlevel via contacts 142 and 144 are formed to penetrate through, and in contact with, the middle capacitor electrode 154 to provide positive power supply voltage (e.g., VDD) connections to the middle capacitor electrode 154. The upper and lower capacitor electrodes 156 and 152 are patterned to have aligned openings which allow the interlevel via contacts 141 and 145 for VDD connections to pass through without contacting the upper and lower capacitor electrodes 156 and 152.

As further shown in FIG. 1B, the truncated via contact 143 is formed in contact with the lower GND metal line 133, and the upper and lower capacitor electrodes 156 and 152 to provide negative power supply voltage (e.g., GND) connections to the upper and lower capacitor electrodes 156 and 152. As compared to the interlevel via contacts ($V_X$) 141, 142, 144, and 145, the truncated via contact ($V_{Tr}$) 143 is a partial via that extends about halfway through the vertical height of the via level to provide a via contact between the GND metal line 133 and the upper and lower capacitor electrodes 156 and 152.

In accordance with embodiments of the invention, the truncated via contacts $V_{Tr}$ are constructed at various locations within the footprint area of an MIM capacitor which overlap regions of coarse grid wiring a single polarity to provide low resistance contacts to regions of the MIM capacitor electrodes which overlap regions of coarse grid wiring. For example, the schematic top plan view of FIG. 1A illustrates a footprint region of the MIM capacitor 150 in phantom (dashed rectangle) which is disposed between the metallization levels $M_{X-1}$ and $M_{X-2}$. FIG. 1A illustrates an array of truncated via contacts $V_{Tr}$ which are formed in contact with the lower GND metal lines 131, 133, and 135 of the metallization level $M_{X-2}$ to provide GND contacts to the upper and lower capacitor electrodes 156 and 152 of the MIM capacitor 150 in regions of the upper and lower capacitor electrodes 156 and 152 which are overlapped by the coarse grid region of VDD metal lines 122, 123, 124 and 125.

In this instance, since there are no GND metal lines interspersed in the coarse grid region of VDD metal lines 122, 123, 124 and 125 of the metallization level $M_{X-1}$, there is no way to fabricate interlevel via contacts ($V_X$) for GND connections between the metallization levels $M_{X-1}$ and $M_{X-2}$ in the coarse grid region of VDD metal lines 122, 123, 124 and 125, which can be used to provide GND connections the MIM capacitor 150 electrodes in said coarse grid region. In the exemplary embodiment of FIGS. 1A and 1B, in the absence of the array of truncated via contacts $V_{Tr}$ for GND connections disposed in the coarse grid region of VDD metal lines 122, 123, 124 and 125, the only GND contacts to the upper and lower capacitor electrodes 156 and 152 of the MIM capacitor 150 would be the interlevel via contacts ($V_X$) for GND connections formed between the GND metal line 121 and the lower GND metal lines 131, 133, and 135, and between the GND metal line 135 and the lower GND metal lines 131, 133, and 135, in the outer boundary of the coarse grid region of VDD metal lines 122, 123, 124 and 125.

Without the truncated via contacts $V_{Tr}$, there would exist relatively large areas of the upper and lower capacitor electrodes 156 and 152 of the MIM capacitor 150 with no low resistance via contacts to GND metal lines disposed within the coarse grid region of VDD metal lines 122, 123, 124 and 125. This would result in an increased resistance in the MIM capacitor 150 due to the long distance current path within the thin, resistive upper and lower capacitor electrodes 156 and 152 of the MIM capacitor 150 between the interlevel via contacts ($V_X$) for GND connections at the outer boundary of the coarse grid region of VDD metal lines 122, 123, 124 and 125. In this regard, the array of truncated via contacts $V_{Tr}$ provide low resistance contacts between the upper and lower capacitor electrodes 156 and 152 of the MIM capacitor 150 and the portions of the GND metal lines 131, 133, and 135 of the underlying metallization level $M_{X-2}$ which are overlapped by the coarse grid region of VDD metal lines 122, 123, 124 and 125 of the upper metallization level $M_{X-1}$. This effectively provides lower resistance paths to the GND electrodes of the MIM capacitor 150, which results in a lower RC time constant and thus a higher cut-off frequency of the MIM capacitor 150.

It is to be understood that while FIG. 1A schematically illustrates an exemplary footprint area covered by the MIM capacitor 150 for purposes of discussion, an MIM capacitor structure can be fabricated with footprint areas ranging from 10s of square microns ($\mu^2$) to hundreds of $\mu m^2$, which will vary depending on the application and the given BEOL layout. Preferably, MIM capacitor structures are formed to provide as much coverage area as possible over the footprint of the given chip, although there would be various cutouts in the MIM capacitor plates to accommodate for interlevel via contacts, inductors, and other types of elements and component that are typically fabricated as part of BEOL interconnect structures. In addition, there can be regions within the footprint of the BEOL layer where MIM capacitors are excluded, e.g., to avoid parasitic capacitances on certain wires above or below the MIM capacitor, such as critical signal wires, etc.

Figure 2:
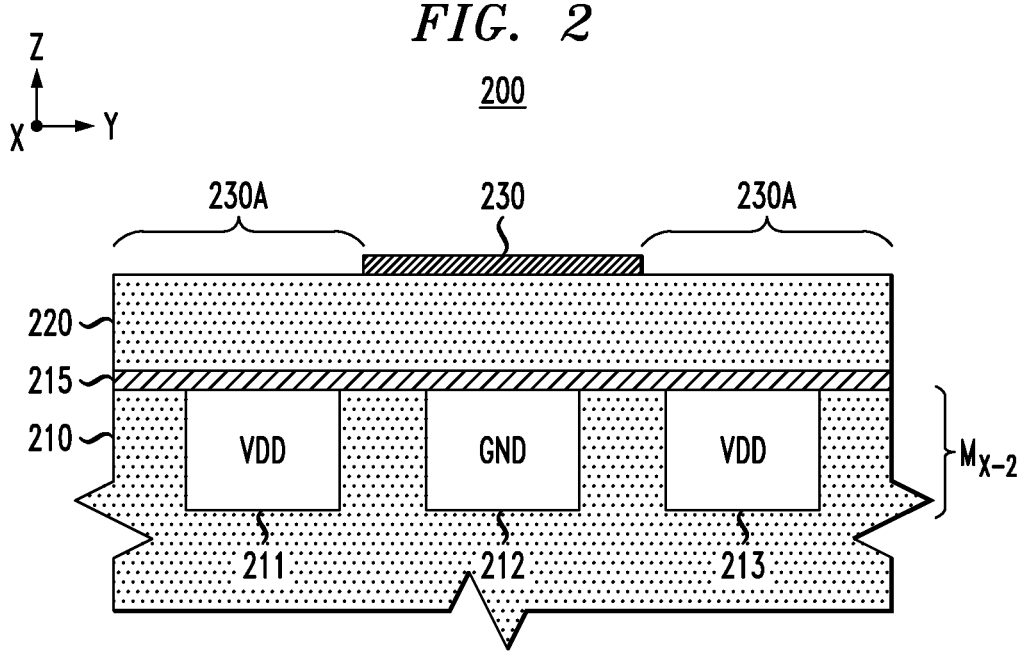

FIGS. 2-8 schematically illustrate a method for fabricating an MIM capacitor structure to provide capacitive decoupling between positive and negative power supply lines of a power distribution network within a BEOL interconnect structure, according to an embodiment of the invention. In particular, FIGS. 2-8 schematically illustrate a method for fabricating a three-electrode MIM capacitor structure with a via contact configuration which comprises truncated via contacts, according to an embodiment of the invention. To begin, FIG. 2 is a schematic cross-sectional side view of a BEOL interconnect structure 200 at an intermediate stage of fabrication which comprises a first ILD layer 210, power distribution lines 211, 212, and 213 formed in the first ILD layer 210, a dielectric capping layer 215 formed on the first ILD insulating layer 210, a first insulating layer 220 formed on the capping layer 215, and a first capacitor electrode 230 (bottom electrode) formed on the first insulating layer 220.

The first ILD layer 210 is formed of any suitable dielectric material that is commonly utilized in BEOL fabrication technologies. For example, the first ILD layer 210 can be formed of a dielectric material including, but not limited to, silicon oxide ($SiO_2$), silicon nitride (e.g., ($Si_3N_4$)), hydrogenated silicon carbon oxide (SiCOH), hydrogenated silicon carbide (SiCH), SiCNH, tetraethyl orthosilicate (TEOS), or other types of silicon-based low-k dielectrics (e.g., k less than about 4.0), porous dielectrics, or known ULK (ultra-low-k) dielectric materials (with k less than about 2.5). The first ILD layer 210 is deposited using known deposition techniques, such as, for example, ALD (atomic layer deposition), CVD (chemical vapor deposition) PECVD (plasma-enhanced CVD), or PVD (physical vapor deposition), or spin-on deposition.

The power distribution lines 211, 212, and 213 comprise a plurality of parallel metal lines which include positive power supply voltage lines 211 and 213 (e.g., VDD metal lines), and a negative power supply voltage line 212 (e.g., GND metal line). The power distribution lines 211, 212, and 213 are formed by a process which comprises patterning trenches in the first ILD layer 210, lining the trenches with a liner layer (e.g., diffusion barrier and/or seed layer), and filling the trenches with metallic material such as copper or other suitable metallic materials. In one embodiment, the power distribution lines 211, 212, and 213 are formed as part of a metallization level $M_{X-2}$ (similar to FIGS. 1A and 1B).

The capping layer 215 comprises a layer of insulating/dielectric material such as silicon nitride (SiN), silicon carbide (SiC), silicon carbon nitride (SiCN), hydrogenated silicon carbide (SiCH), a multilayer stack comprising the same or different types of dielectric materials, etc., or other suitable low-k dielectric materials which are non-reactive with the metallic material that is used to form metallic lines 211, 212 and 213. In one example embodiment, the capping layer 215 is formed with a thickness in a range of about 2 nm to about 60 nm, or thicker than 60 nm for the upper BEOL layers.

The first insulating layer 220 is formed of the same or similar material as the first ILD layer 210. In one embodiment, the first insulating layer 220 is formed with a thickness that is about one-half of the thickness of the total thickness of a second ILD layer (e.g., ILD layer 226, FIG. 7) which is formed between the metallization level $M_{X-2}$ and the next upper metallization level $M_{X-1}$, so that the MIM capacitor is disposed within a middle region of the via level between the metallization levels $M_{X-2}$ and $M_{X-1}$.

The first capacitor electrode 230 is formed by depositing a layer of metallic material on the first insulating layer 220 and patterning the layer of metallic material to form the first capacitor electrode 230. In one embodiment, the first capacitor electrode 230 is formed of titanium nitride (TiN). In other embodiments, the first capacitor electrode 230 is formed of other types of metallic materials such as aluminum nitride (AlN), which are suitable for the given application. The first capacitor electrode 230 is formed with a thickness in a range of about 20 nm to about 50 nm. As shown in FIG. 2, the first capacitor electrode 230 is patterned to form open regions 230A which, as explained in further detail below, allow interlevel via contacts to be formed in contact with the underlying VDD metal lines 211 and 213 without contacting the first capacitor electrode 230.

Figure 3:
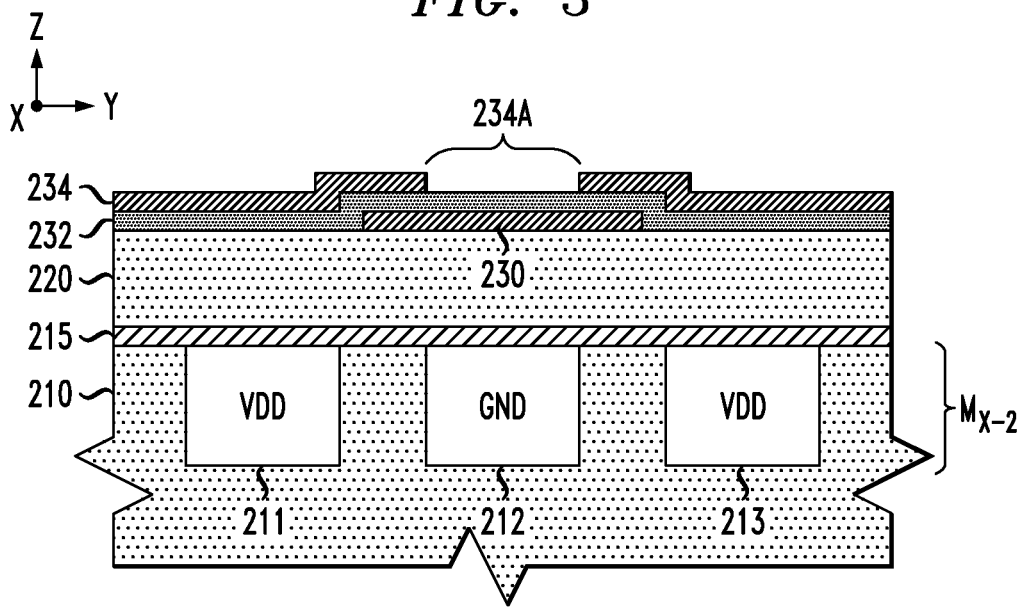

Next, FIG. 3 is a schematic cross-sectional side view of the BEOL interconnect structure shown in FIG. 2 after depositing a first high-k dielectric film 232 over the first capacitor electrode 230 and after depositing and patterning a layer of metallic material over the first high-k dielectric film 232 to form a second capacitor electrode 234. In one embodiment, the first high-k dielectric film 232 is formed of a high-k dielectric material having a dielectric constant of about 3.9 or greater. For example, in some embodiments, the first high-k dielectric film 232 is formed of a metal oxide such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any suitable high-k dielectric material that is suitable for use as dielectric layer for a MIM capacitor.

The thickness of the first high-k dielectric film 232 will depend on the desired amount of capacitance of the MIM capacitor structure, wherein the capacitance is (i) directly proportional to the dielectric constant of the first high-k dielectric film 232 and (ii) inversely proportional to the thickness of the first high-k dielectric film 232. The first high-k dielectric film 232 is deposited using known methods such as ALD, for example, which allows for high conformality of the dielectric film.

In one embodiment, the second capacitor electrode 234 is formed of the same metallic material as the first capacitor electrode 230. For instance, the second capacitor electrode 234 is formed of TiN or AlN, or other metallic materials which are suitable for fabricating MIM capacitor electrodes. In another embodiment, the second capacitor electrode 234 can be formed of a metallic material which is different from the metallic material of the first capacitor electrode 230. The second capacitor electrode 234 is formed with a thickness in a range of about 20 nm to about 50 nm. The second capacitor electrode 234 is patterned to form an open region 234A which, as explained in further detail below, allows a truncated via to be formed in contact with the underlying GND metal line 212 without contacting the second capacitor electrode 234.

Next, FIG. 4 is a schematic cross-sectional side view of the BEOL interconnect structure shown in FIG. 3 after depositing a second high-k dielectric film 236 over the second capacitor electrode 234 and after depositing and patterning a layer of metallic material over the second high-k dielectric film 236 to form a third capacitor electrode 238. In the exemplary embodiment shown in FIG. 4, the first capacitor electrode 230, the first high-k dielectric film 232, the second capacitor electrode 234, the second high-k dielectric film 236, and the third capacitor electrode 238 form a three-electrode MIM capacitor structure 240.

In one embodiment, the second high-k dielectric film 236 is formed of the same or similar material and thickness as the first high-k dielectric film 232, and the third capacitor electrode 238 is formed of the same or similar metallic material and thickness as the first and second capacitor electrodes 230 and 234. As shown in FIG. 4, the third capacitor electrode 238 is patterned to form open regions 238A which, as explained in further detail below, allow interlevel via contacts to be formed in contact with the underlying VDD metal lines 211 and 213 without contacting the third capacitor electrode 238.

Next, FIG. 5 is a schematic cross-sectional side view of the BEOL interconnect structure shown in FIG. 4 after forming a second insulating layer 222 over the first insulating layer 220 and the MIM capacitor 240. In one embodiment the second insulating layer 222 is formed by a process which comprises depositing a layer of insulating material to cover the MIM capacitor 240, and planarizing the deposited layer of insulating material using, e.g., a chemical mechanical polishing (CMP) process, to planarize the surface of the layer of insulating material down to a target thickness. In one embodiment, the second insulating layer 222 is formed of the same or similar materials as the first insulating layer 220. The second insulating layer 222 forms a portion of the second ILD layer (e.g., ILD layer 226, FIG. 7) which is formed between the metallization level $M_{X-2}$ and the next upper metallization level $M_{X-1}$. The second insulating layer 222 provides a planarized surface to enable formation of a truncated via contact.

Figure 6:
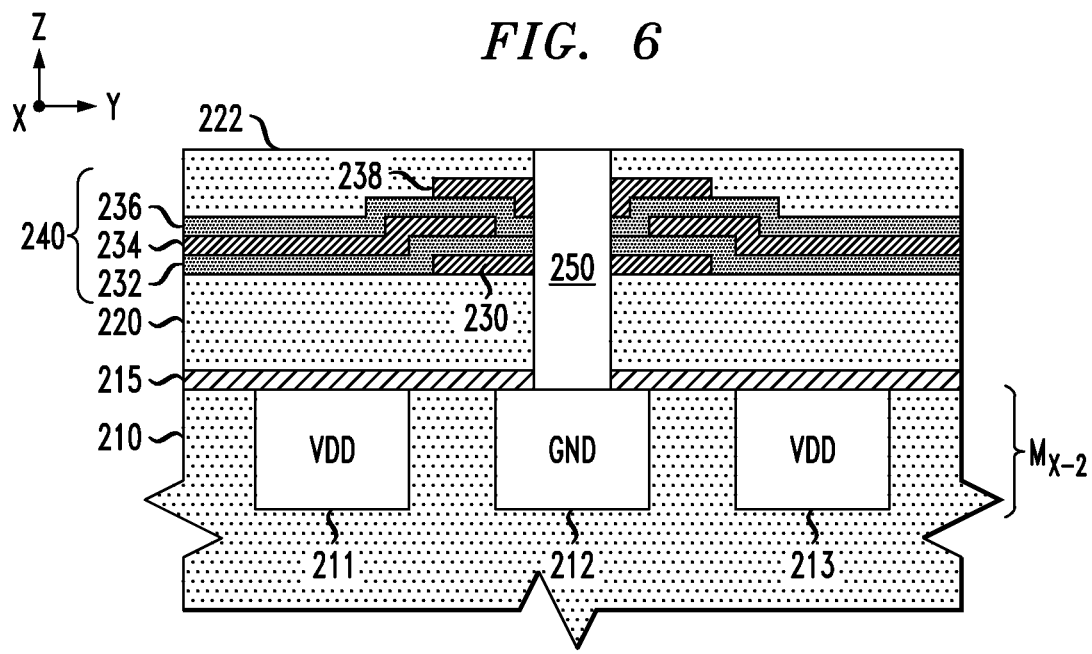

In particular, FIG. 6 is a schematic cross-sectional side view of the BEOL interconnect structure shown in FIG. 5 after forming a truncated via contact 250 to connect the first and third capacitor electrodes 230 and 238 to the underlying GND metal line 212. As shown in FIG. 6, the first and third capacitor electrodes 230 and 238 are in contact with sidewalls of the truncated via contact 250, while the truncated via contact 250 passes through the patterned opening 234A of the second capacitor electrode 234. In this regard, the truncated via contact 250 provides a low resistive contact to the GND metal line 212 at the given locations of the first and third capacitor electrodes 230 and 238.

The truncated via contact 250 is formed by any suitable process which comprises (i) forming an etch mask on the second insulating layer 222 with an opening that defines an image of the truncated via contact 250, (ii) anisotropically etching a via contact opening down through the layers 222, 238, 236, 232, 230, 220 and 215 to expose a portion of the GND metal line 212, (iii) depositing one or more layers of liner material to line the sidewall and bottom surfaces of the via contact opening with a liner (e.g., diffusion barrier layer and/or seed layer), (iv) depositing a layer of metallic material to fill the via contact opening; and (v) planarizing the surface of the BEOL interconnect structure down to the upper surface of the second insulating layer 222 to remove the overburden liner and metallic material of the deposited layers, resulting in the structure shown in FIG. 6. In one embodiment, the liner may be formed of one or more conformal layers of metallic material such as a titanium (Ti) and/or titanium nitride (TiN) liner, to line the bottom and sidewall surfaces of the via contact opening. In one embodiment, the truncated via contact 250 is formed with metallic fill material such as copper, tungsten, cobalt, ruthenium, etc.

Figure 7:
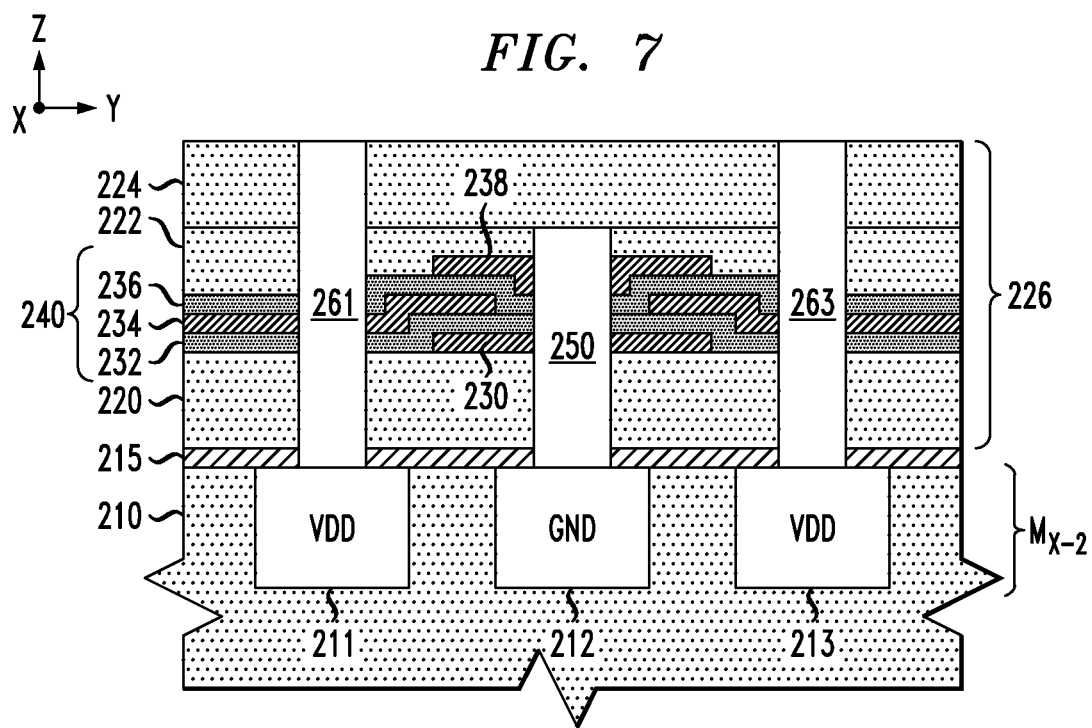

Next, FIG. 7 is a schematic cross-sectional side view of the BEOL interconnect structure shown in FIG. 6 after forming a third insulating layer 224 over the second insulating layer 222, and after forming interlevel via contacts 261 and 263 to connect the second capacitor electrode 234 to the underlying VDD metal lines 211 and 213. In one embodiment, the third insulating layer 224 is formed of the same or similar material as the second insulating layer 224. In the example embodiment of FIG. 7, the first, second and third insulating layers 220, 222, and 224 collectively form the second ILD layer 226 which is disposed between the metallization level $M_{X-2}$ and the next upper metallization level $M_{X-1}$. As shown in FIG. 7, the second capacitor electrode 234 makes contact to the sidewalls of the interlevel via contacts 261 and 263, while the interlevel via contacts 261 and 263 pass through the patterned openings 230A and 238A of the first and third capacitor electrodes 230 and 238. In this regard, the interlevel via contacts 261 and 263 provide low resistive contacts to the VDD metal lines 211 and 213 at different locations of the second capacitor electrode 236.

The interlevel via contacts 261 and 263 are formed by any suitable process which comprises (i) forming an etch mask on the third insulating layer 224 with openings that define images of the interlevel via contacts 261 and 263, (ii) anisotropically etching interlevel via contact openings down through the layers 224, 222, 236, 234, 220, and 215 to expose portions of the VDD metal lines 211 and 213, (iii) depositing one or more layers of liner material to line the sidewall and bottom surfaces of the interlevel via contact openings with a liner (e.g., diffusion barrier layer and/or seed layer), (iv) depositing a layer of metallic material to fill the interlevel via contact openings; and (v) planarizing the surface of the BEOL interconnect structure down to the upper surface of the third insulating layer 224 to remove the overburden liner and metallic material of the deposited layers, resulting the structure shown in FIG. 7. In one embodiment, the liner materials and metallic fill materials of the interlevel via contacts 261 and 263 are the same or similar materials used to form the truncated via contact 250.

Figure 8:
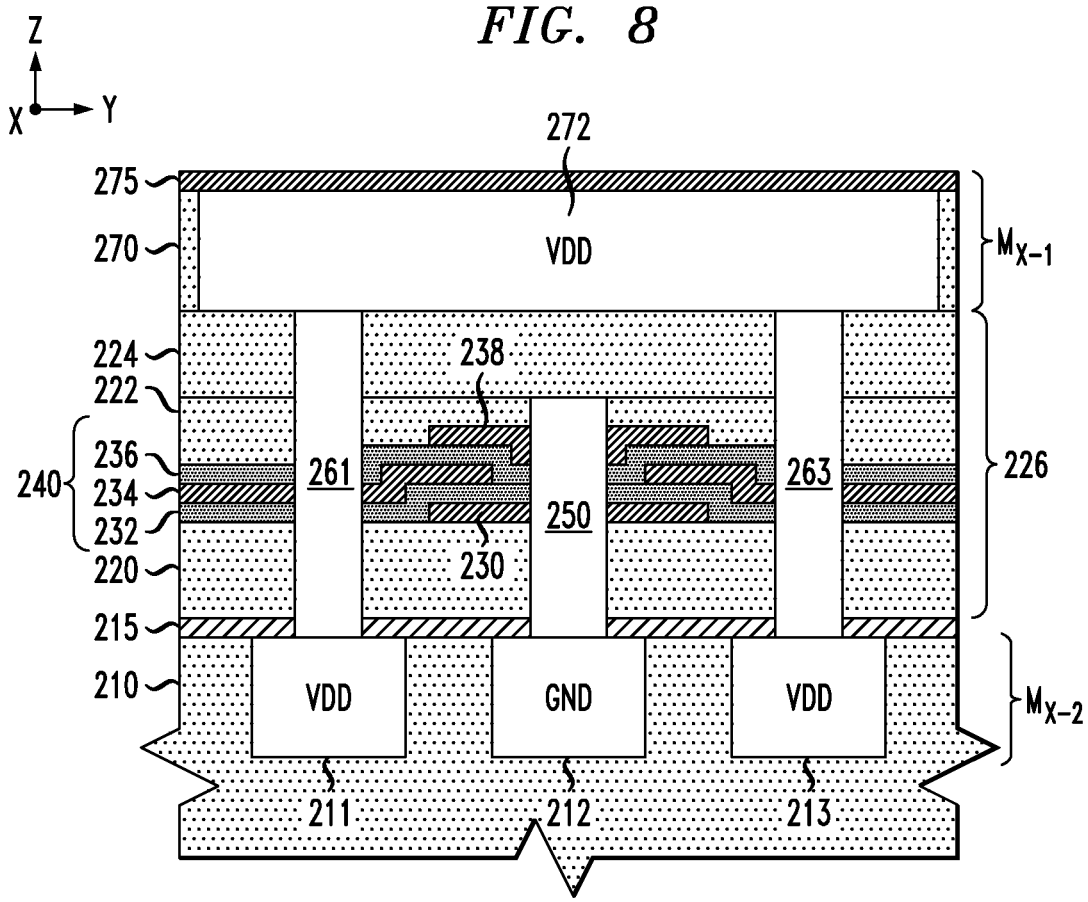

Next, FIG. 8 is a schematic cross-sectional side view of the BEOL interconnect structure shown in FIG. 7 after forming a third ILD layer 270, forming power distribution lines (e.g., power distribution line 272) in the third ILD layer 270, and forming a capping layer 275 over the third ILD layer 270. The third ILD layer 270 is formed of the same or similar dielectric materials (e.g., silicon oxide, TEOS, etc.) as the first ILD layer 210 and second ILD layer 226, which are commonly utilized in BEOL fabrication technologies. The power distribution line 272 is part of a plurality of parallel metal lines of the same polarity (e.g., VDD power supply voltage lines) which are formed as part of a metallization level $M_{X-1}$ (similar to FIGS. 1A and 1B), wherein the power distribution lines of the metallization level $M_{X-1}$ extend orthogonal to the power distribution lines 211, 212, and 213 of the lower metallization level $M_{X-2}$. The power distribution line 272 is formed by a process which comprises patterning trenches in the third ILD layer 270, lining the trenches with a liner layer (e.g., diffusion barrier and/or seed layer), and filling the trenches with metallic material such as copper or other suitable metallic materials to form the power distribution line 272 and other lines (not specifically shown in FIG. 8). The capping layer 275 is formed of the same or similar materials as the capping insulating layer 215 discussed below, which are non-reactive with the metallic material that is used to form the metallic power distribution lines (e.g., metal line 272) of the metallization level $M_{X-1}$.

As shown in FIG. 8, the VDD metal line 272 is formed in contact with the interlevel via contact 261 and the interlevel via contact 263. This allows the metal line 272 of the upper metallization level $M_{X-1}$ to distribute positive power supply voltage to the VDD metal lines 211 and 213 of the underlying metallization level $M_{X-2}$ while providing VDD connections to various locations of the second capacitor electrode 234 of the MIM capacitor 240 through contact of the second capacitor electrode 234 to sidewalls of the interlevel via contacts 261 and 263. In the exemplary embodiment of FIG. 8, the metal line 272 is part of a wide region of wiring of a single polarity (e.g., VDD) in the upper metallization level $M_{X-1}$, which overlaps GND metal lines (e.g., metal line 212) of the underlying metallization level $M_{X-2}$. In this regard, the truncated via contact 250 provides a low resistive contact from the first and second capacitor electrodes 230 and 238 to the GND metal line 212 in the region of the MIM capacitor 240 which is overlapped by the large region of VDD wiring (which includes the metal line 272) in the upper metallization level $M_{X-1}$. While FIG. 8 illustrates the metal line 272 having a length which extends over the three underlying metal lines 211, 212, and 213 for illustrative purposes, it is to be understood that the metal line 272 could extend longer (in the Y-direction) to overlap four or more underlying metal lines in the lower metallization level $M_{X-2}$.

Figure 9:
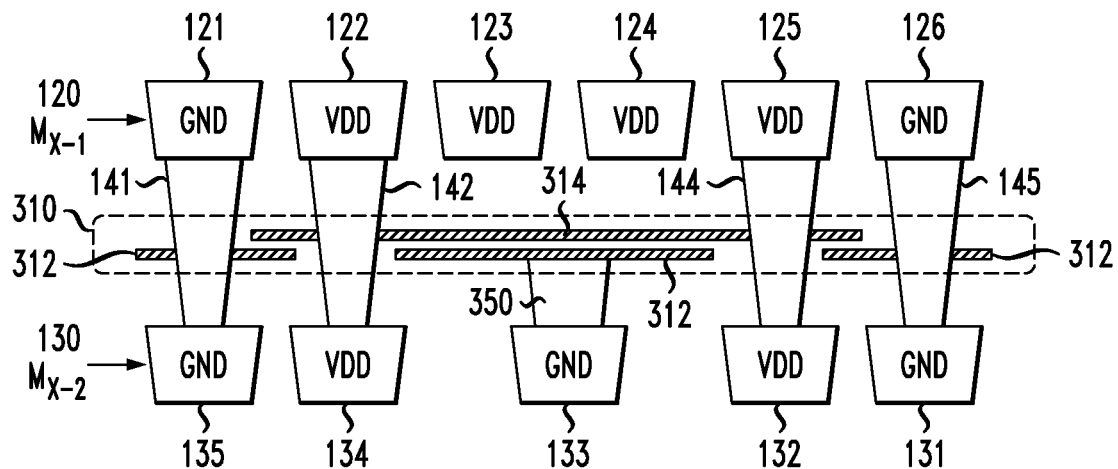
FIG. 9 is a schematic side view of a BEOL interconnect structure comprising a MIM capacitor to provide capacitive decoupling between positive and negative power supply lines of a power distribution network, according to another exemplary embodiment of the invention.

FIG. 9 is a schematic side view of a BEOL interconnect structure 300 comprising a MIM capacitor to provide capacitive decoupling between positive and negative power supply lines of a power distribution network, according to another exemplary embodiment of the invention. The BEOL interconnect structure 300 of FIG. 9 is similar to the BEOL interconnect structure 100 of FIGS. 1A and 1B with respect to the power distribution lines 120 and 130 and the interlayer via contacts 141, 142, 144 and 145. However, FIG. 9 schematically illustrates an embodiment of a two-electrode MIM capacitor structure 310 which is integrally formed in a via level between the metallization level $M_{X-1}$ and the metallization level $M_{X-2}$, and a via contact configuration which comprises MIM capacitor plates that are formed on truncated via contacts.

In particular, as shown in FIG. 9, the MIM capacitor 310 comprises a first capacitor electrode 312 (or bottom capacitor electrode), and a second capacitor electrode 314 (or top capacitor electrode). Although not specifically shown in FIG. 9, the MIM capacitor 310 comprises a layer of high-k dielectric material disposed between the top and bottom capacitor electrodes 312 and 314. The via level between the metallization level $M_{X-1}$ and the metallization level $M_{X-2}$ further comprises layers of low-k dielectric material which form an ILD layer that encapsulates the MIM capacitor 310.

As further shown in FIG. 9, the MIM capacitor 310 comprises a via contact configuration which comprises the interlevel via contacts 141, 142, 144, and 145 as discussed above, and a truncated via contact 350 to provide a vertical connection between the bottom capacitor electrode 312 and the underlying GND metal line 133. In this exemplary embodiment, the truncated via contact 350 comprises an "MIM-on-via contact" in that the truncated via contact 350 is first formed in an insulating layer in contact with the lower GND metal line 133, and the bottom capacitor electrode 312 is then formed over the insulating layer in contact with the truncated via contact 350. In this embodiment, similar to the truncated via contact 143 (shown in FIG. 1B), the truncated via contact 350 provides a low resistive contact from the bottom capacitor electrode 312 to the GND metal line 133 in the region of the MIM capacitor 310 which is overlapped by the large region of VDD wiring (e.g., metal lines 122, 123, 124, and 125) in the upper metallization level $M_{X-1}$.

Figure 10:
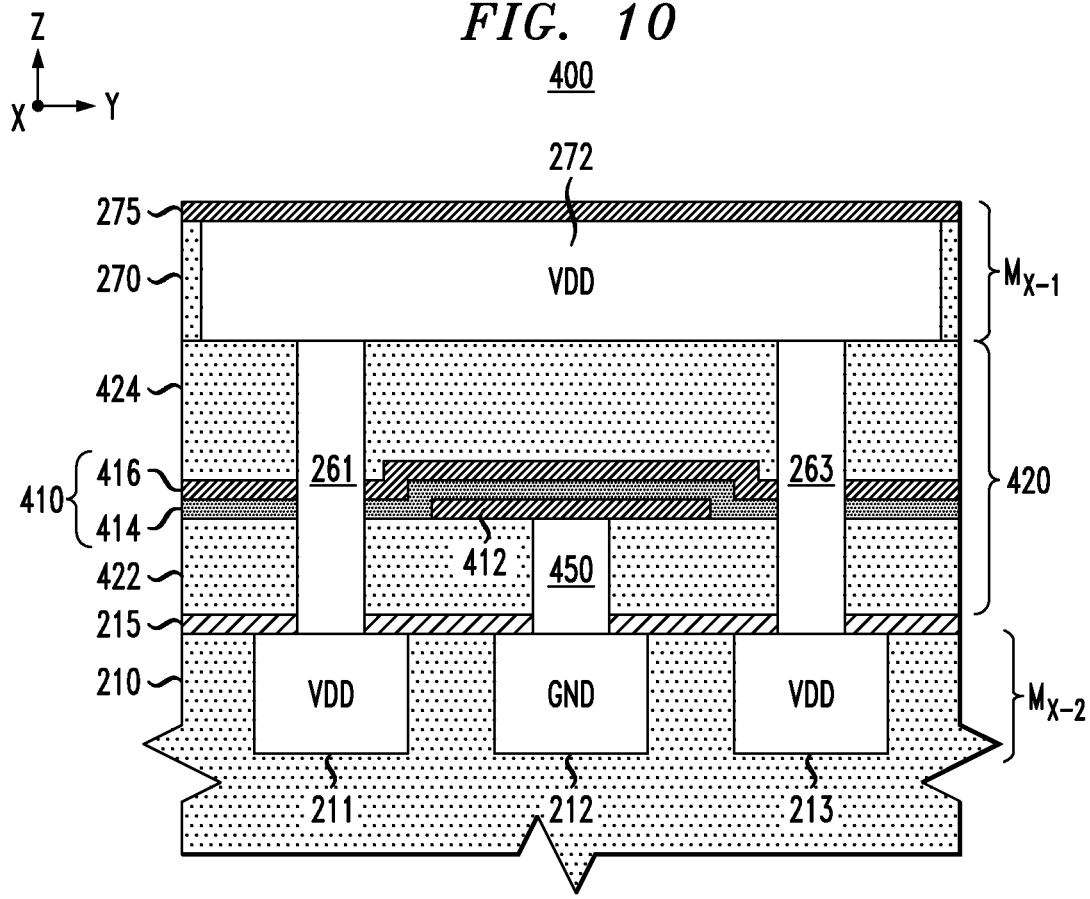
FIG. 10 is a schematic side view of a BEOL interconnect structure comprising a MIM capacitor to provide capacitive decoupling between positive and negative power supply lines of a power distribution network, according to another exemplary embodiment of the invention.

FIG. 10 is a schematic side view of a BEOL interconnect structure 400 comprising a MIM capacitor to provide capacitive decoupling between positive and negative power supply lines of a power distribution network, according to another exemplary embodiment of the invention. The BEOL interconnect structure 400 of FIG. 10 is based on the two-electrode MIM capacitor structure 310 of FIG. 9 with a via contact configuration comprising interlevel via contacts and MIM-on-via contacts. Further, the BEOL interconnect structure 400 of FIG. 10 is similar in structure to the BEOL interconnect structure 200 shown in FIG. 8 and can be fabricated using a similar process flow as described above in conjunction with FIGS. 2-8.

In particular, the BEOL interconnect structure 400 is similar to the BEOL interconnect structure 200 of FIG. 8, except that FIG. 10 schematically illustrates a two-electrode MIM capacitor structure 410 which is encapsulated in an ILD layer 420 between the metallization levels $M_{X-1}$ and $M_{X-2}$. The MIM capacitor 410 comprises a first electrode 412, a high-k dielectric layer 414, and a second capacitor electrode 416. The ILD layer 420 comprises a first insulating layer 422 formed on the capping layer 215 and a second insulating layer 424 formed over the first insulating layer 422 and encapsulating the MIM capacitor 410. As further shown in FIG. 10, a truncated via contact 450 (e.g., MIM-on-via contact) is formed in the first insulating layer 422 in contact with the GND metal line 212. The first capacitor electrode 412 is formed on the first insulating layer 422 in contact with the truncated via contact 450.

In FIG. 10, the truncated via contact 450 provides a low resistive contact from the GND metal line 212 to the bottom capacitor electrode 412 in the region of the MIM capacitor 410 that is overlapped by the large region of VDD wiring (which includes the metal line 272) in the upper metallization level $M_{X-1}$. The interlevel via contacts 261 and 263 provide low resistive contacts from the VDD metal lines 211, 213, and 272 to different locations of the second capacitor plate 416. The BEOL interconnect structure 400 of FIG. 10 can be fabricated using the process flow and materials as described above in conjunction with FIGS. 2-8, except that the truncated via contact 450 is fabricated prior to forming the first capacitor electrode 412. The truncated via contact 450 is fabricated by a process which comprises patterning a via opening in the first insulating layer 422 and filling the via opening with metallic material to form the truncated via contact 450.

Figure 11:
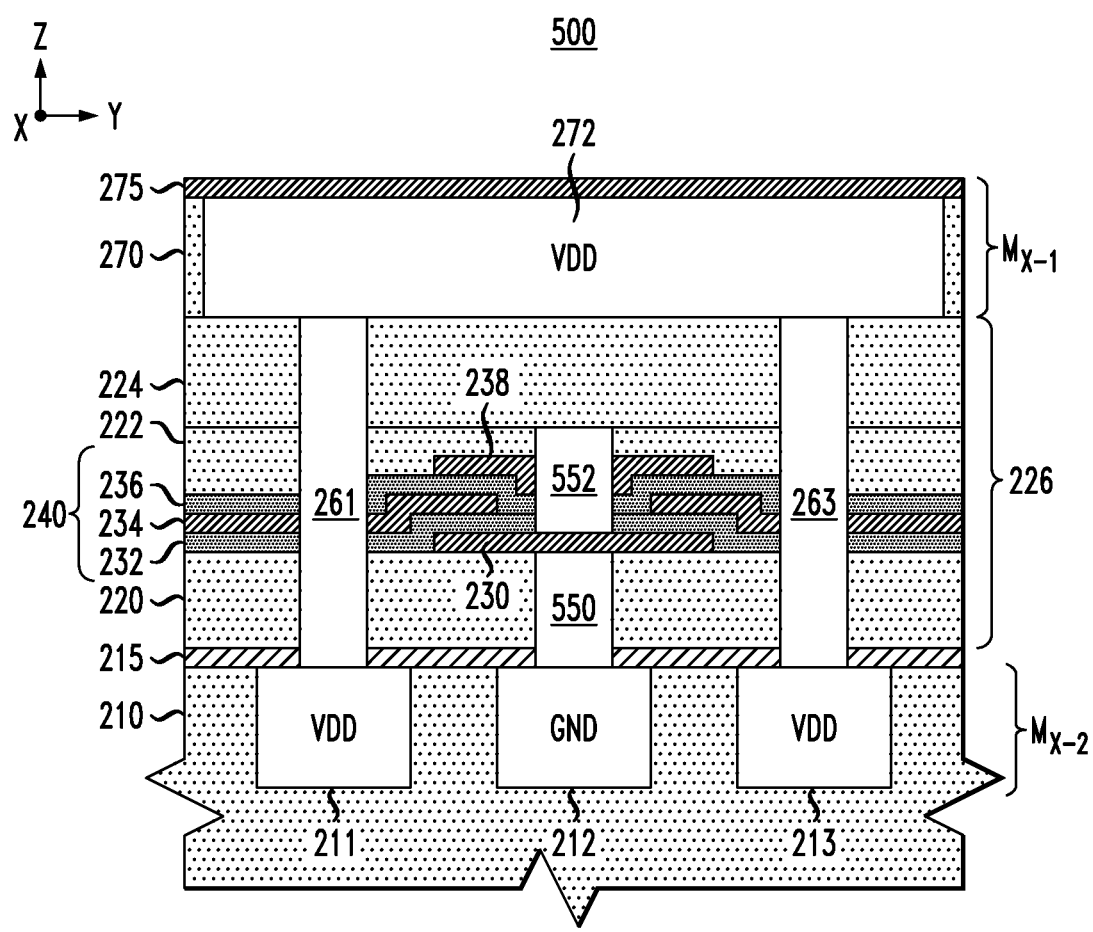
FIG. 11 is a schematic side view of a BEOL interconnect structure comprising a MIM capacitor to provide capacitive decoupling between positive and negative power supply lines of a power distribution network, according to another exemplary embodiment of the invention.

FIG. 11 is a schematic side view of a BEOL interconnect structure 500 comprising a MIM capacitor to provide capacitive decoupling between positive and negative power supply lines of a power distribution network, according to another exemplary embodiment of the invention. The BEOL interconnect structure 500 of FIG. 11 is similar to the BEOL interconnect structure 200 of FIG. 8, except that that the MIM capacitor 240 implements a via contact configuration which comprises a first truncated via contact 550 (e.g., MIM-on-via contact) and a second truncated via contact 552 to connect the first and third capacitor electrodes 230 and 238 to the underlying GND metal line 212. In this embodiment, the first truncated via contact 550 is formed in the first insulating layer 220 using a single damascene process prior to forming the first capacitor electrode 230. The second truncated via contact 552 is formed using a single damascene process following formation of the second insulating layer 222. However, in this embodiment, the second truncated via contact 552 is fabricated to a depth to make contact to an upper surface of the first capacitor electrode 230. This is in contrast to the process shown in FIG. 6 wherein the truncated via contact 250 is formed through the first capacitor electrode 230 down to the underlying GND metal line 212. In another embodiment, the second truncated via contact 552 can be formed to at least partially penetrate the first capacitor electrode 230 or penetrate through the first capacitor electrode 230 and make direct contact to the first truncated via contact 550.

Figure 12:
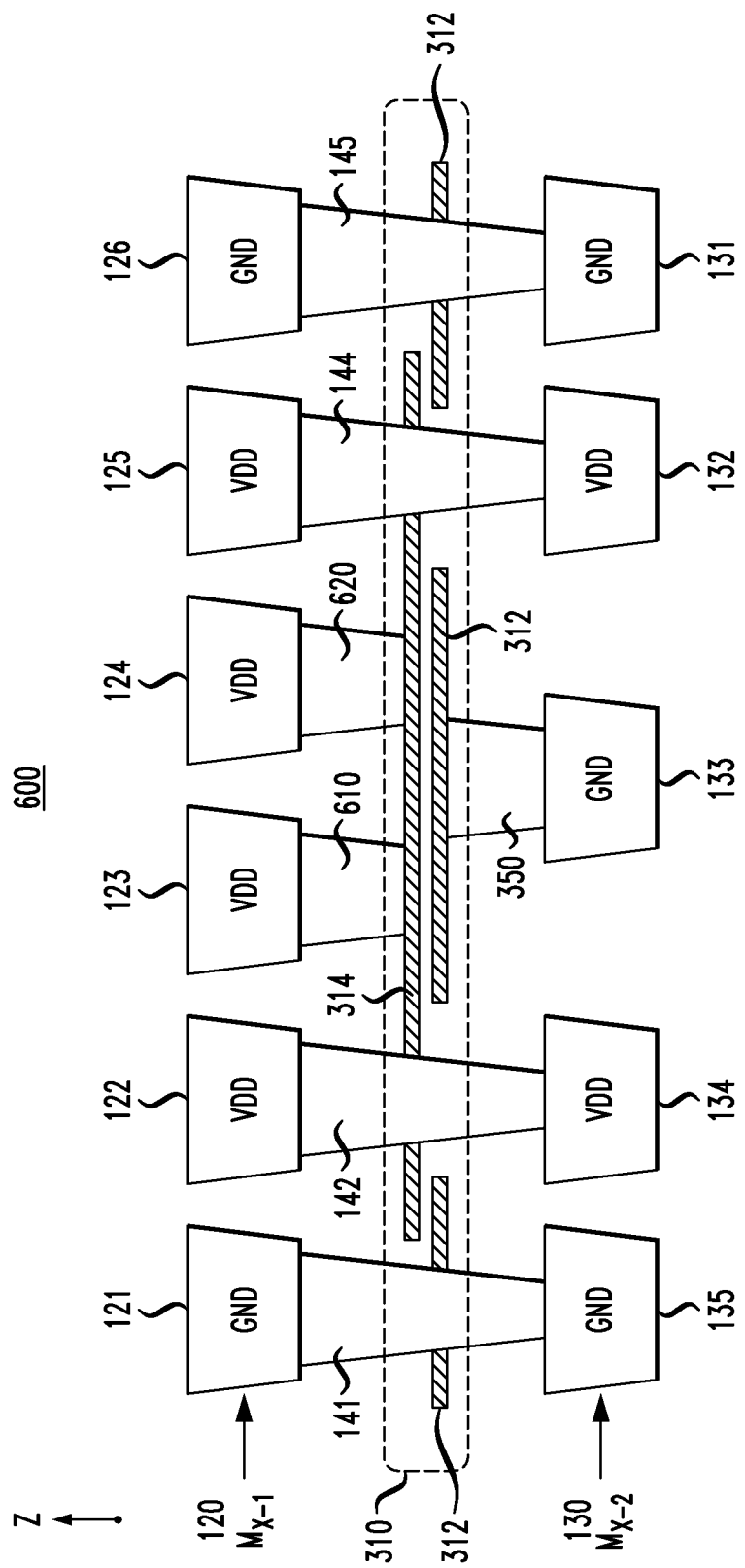
FIG. 12 is a schematic side view of a BEOL interconnect structure comprising a MIM capacitor to provide capacitive decoupling between positive and negative power supply lines of a power distribution network, according to another exemplary embodiment of the invention.

FIG. 12 is a schematic side view of a BEOL interconnect structure 600 comprising a MIM capacitor to provide capacitive decoupling between positive and negative power supply lines of a power distribution network, according to another exemplary embodiment of the invention. The BEOL interconnect structure 600 of FIG. 12 is similar to the BEOL interconnect structure 300 of FIG. 9 with respect to the power distribution lines 120 and 130, the interlayer via contacts 141, 142, 144 and 145, and the truncated via contact 350 (e.g., MIM-on-via contact). However, FIG. 12 schematically illustrates an embodiment wherein the via contact configuration further comprises truncated via contacts 610 and 620 (of the type "via contact-on-MIM") to connect the second plate 314 of the two-electrode MIM capacitor structure 310 to the VDD metal lines 123 and 124 of the upper metallization level $M_{X-1}$.

In the embodiment of FIG. 12, the truncated via contacts 610 and 620 are formed in an insulating layer above the second capacitor electrode 314 and land on the upper surface of the second capacitor electrode 314. The truncated via contacts 610 and 620 serve to further reduce the resistive component of the MIM capacitor structure 310 by providing low resistive contacts to locations of the second capacitor plate 314 between the interlevel via contacts 142 and 144. Again, the reduced spacing between via contacts to the MIM capacitor 310 serves to increase the cutoff frequency of the MIM capacitor 310.

Figure 13:
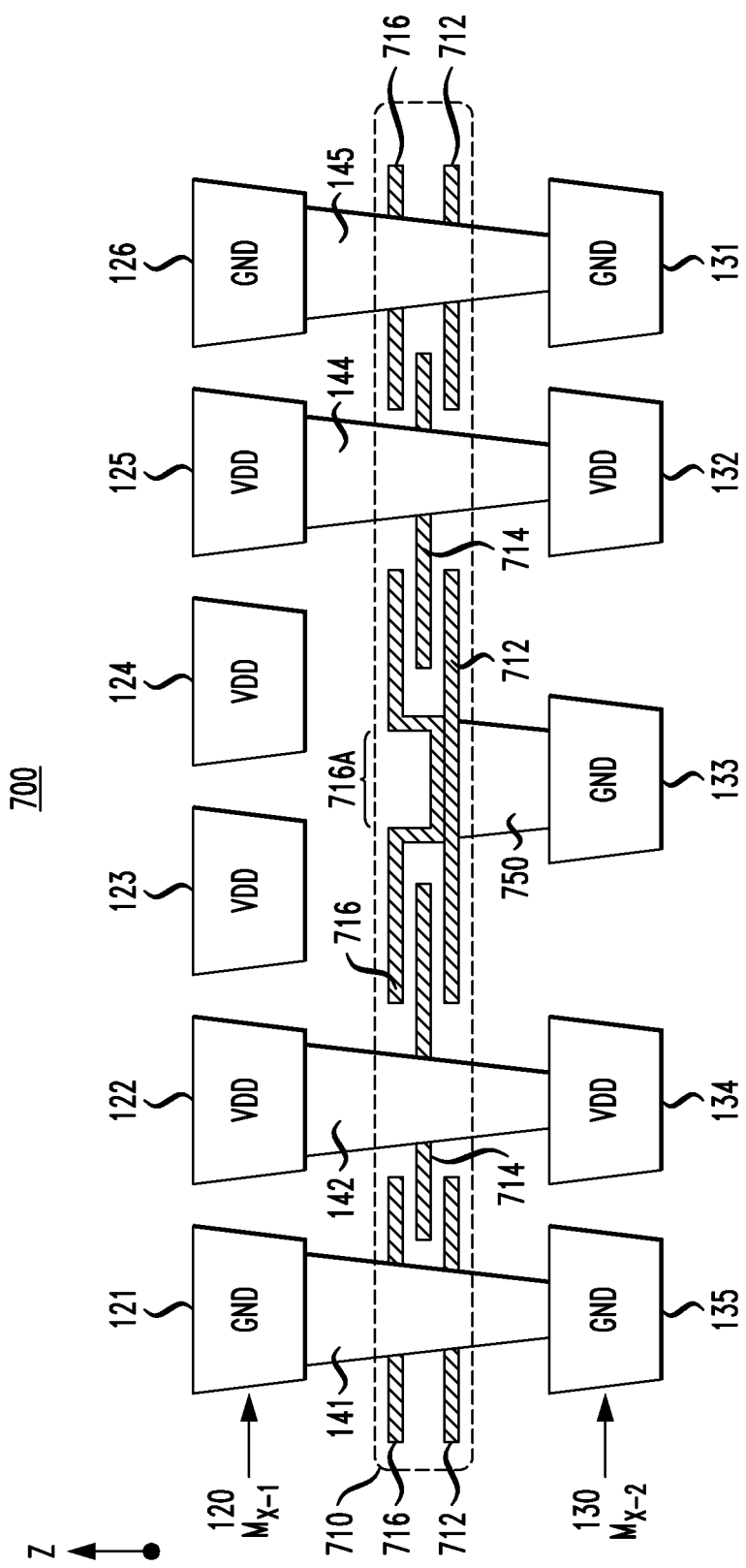
FIG. 13 is a schematic side view of a BEOL interconnect structure comprising a MIM capacitor to provide capacitive decoupling between positive and negative power supply lines of a power distribution network, according to another exemplary embodiment of the invention.

FIG. 13 is a schematic side view of a BEOL interconnect structure 700 comprising a MIM capacitor to provide capacitive decoupling between positive and negative power supply lines of a power distribution network, according to another exemplary embodiment of the invention. The BEOL interconnect structure 700 of FIG. 12 is similar to the BEOL interconnect structure 100 of FIGS. 1A and 1B in that the BEOL interconnect structure 700 comprises the power distribution lines 120 and 130 and the interlayer via contacts 141, 142, 144 and 145. The BEOL interconnect structure 700 comprises a three-electrode MIM capacitor 710 which includes a first capacitor electrode 712, a second capacitor electrode 714, and a third capacitor electrode 716, wherein a connecting portion 716A (or merged connection) of the third capacitor electrode 716 is formed to connect the third capacitor electrode to the first capacitor electrode 712.

Similar to the embodiment shown in FIG. 1B, the interlevel via contacts 141 and 145 are formed to penetrate through, and in contact with, the upper capacitor electrode 716 and the bottom capacitor electrode 712 to provide negative power supply voltage (e.g., GND) connections to the upper and lower capacitor electrodes 716 and 712. In addition, the interlevel via contacts 142 and 144 are formed to penetrate through, and in contact with, the middle capacitor electrode 714 to provide positive power supply voltage (e.g., VDD) connections to the middle capacitor electrode 714. Furthermore, similar to the embodiments shown in FIGS. 9, 10, and 11, a truncated via contact 750 (e.g., MIM-on-via contact) is formed to provide a low-resistive connection between the GND metal line 133 and a location of the first capacitor plate 712 in a region of the MIM capacitor 710 which is overlapped by the wide region of VDD metal lines 122, 123, 124, and 125 between the GND metal lines 121 and 126 in the upper metallization level $M_{X-1}$.

Furthermore, in the exemplary embodiment of FIG. 13, the connecting portion 716A of the third capacitor plate 716 is connected to a portion of the first capacitor electrode 712 in alignment to the truncated via contact 750. In this regard, the connecting portion 716A effectively provides a low-resistive connection between the third capacitor plate 716 and the GND metal line 133 in the region of the MIM capacitor 710 which is overlapped by the wide region of VDD metal lines 122, 123, 124, and 125 between the GND metal lines 121 and 126 in the upper metallization level $M_{X-1}$. The merged connection between the first and third capacitor plates 712 and 716 by the connection portion 716A of the third capacitor plate 716 eliminates the need to fabricate a truncated via contact (e.g., truncated via contact 552, as shown in FIG. 11) to connect the third capacitor plate 716 to the first capacitor plate 712 to provide a low resistive GND contact to the third capacitor plate 716 in the region of the MIM capacitor 710 which is overlapped by the wide region of VDD metal lines 122, 123, 124, and 125.

In the embodiment of FIG. 13, the MIM capacitor structure 710 could be fabricated using a similar process flow as shown in FIGS. 2-4. However, before depositing and patterning the third (upper) capacitor electrode, an etch process would be performed to etch an opening through the first and second high-k dielectric layers down the first (bottom) capacitor electrode. The third (upper) capacitor electrode would then be formed by depositing a conformal layer of metallic material (e.g., TiN), wherein the metallic material would be conformally deposited on the sidewalls and bottom of the etched opening in the first and second high-k dielectric layers to form the connecting portion 716A, thereby connecting the third (upper) capacitor electrode to the first (lower) capacitor electrode.

It is to be understood that the methods discussed herein for fabricating MIM capacitor structures as part of a BEOL interconnect structure can be incorporated within semiconductor processing flows for fabricating various types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A device, comprising:
an interconnect structure comprising a first metallization level and a second metallization level, wherein the first and second metallization levels comprise metal lines which form wiring of a power distribution network for distributing power supply voltage of a first polarity and power supply voltage of a second polarity, wherein the second metallization level comprises a dense region of metal lines to distribute power supply voltage of the first polarity;
a metal-insulator-metal capacitor disposed between the first and second metallization levels, wherein the metal-insulator-metal capacitor comprises a first capacitor electrode, a second capacitor electrode, and a first capacitor dielectric layer disposed between the first and second capacitor electrodes;
a first interlevel via contact which connects a metal line of the first metallization level with a metal line of the second metallization level to distribute power supply voltage of the first polarity between the first and second metallization levels;
wherein the first interlevel via contact penetrates through the second capacitor electrode with the second capacitor electrode in contact with sidewalls of the first interlevel via contact to distribute power supply voltage of the first polarity to the second capacitor electrode; and
a first truncated via contact which connects a metal line of the first metallization level to the first capacitor electrode in a location of the metal-insulator-metal capacitor which is overlapped by the dense region of metal lines of the second metallization level;
wherein the first truncated via contact distributes power supply voltage of the second polarity to the first capacitor electrode.

2. The device of claim 1, wherein the first truncated via contact penetrates through the first capacitor electrode with the first capacitor electrode in contact with sidewalls of the first truncated via contact.

3. The device of claim 1, wherein the first capacitor electrode is disposed on, and in contact with, a surface of the first truncated via contact.

4. The device of claim 1, further comprising a second truncated via contact which connects a metal line within the dense region of metal lines of the second metallization level to the second capacitor electrode, wherein the second truncated via contact distributes power supply voltage of the first polarity to the second capacitor electrode.

5. The device of claim 1, wherein the metal-insulator-metal capacitor further comprises a third capacitor electrode, and a second capacitor dielectric layer disposed between the second and third capacitor electrodes, wherein the first and third capacitor electrodes comprise aligned openings which allow the first interlevel via contact to pass through the first and third capacitor electrodes without contacting the first and third capacitor electrodes.

6. The device of claim 5, wherein the first truncated via contact is further connected to the third capacitor electrode in the location of the metal-insulator-metal capacitor which is overlapped by the dense region of metal lines of the second metallization level, wherein the second capacitor electrode comprises an opening which allows the first truncated via contact to pass through the second capacitor electrode without contacting the second capacitor electrode.

7. The device of claim 5, further comprising a second interlevel via contact which connects a metal line of the first metallization level with a metal line of the second metallization level to distribute power supply voltage of the second polarity between the first and second metallization levels, wherein the second interlevel via contact penetrates through the first and third capacitor electrodes with the first and third capacitor electrodes in contact with sidewalls of the second interlevel via contact to distribute power supply voltage of the second polarity to the first and third capacitor electrodes, and wherein the second capacitor electrode comprises an opening which allows the second interlevel via contact to pass through the second capacitor electrode without contacting the second capacitor electrode.

8. The device of claim 5, wherein the third capacitor electrode comprises a connecting portion, which extends through patterned openings of the first and second capacitor dielectric layers and the second capacitor electrode, to connect the third capacitor electrode to the first capacitor electrode at a location where the first truncated via contact is connected to the first capacitor electrode.

9. The device of claim 5, further comprising a second truncated via contact, which extends through patterned openings of the first and second capacitor dielectric layers and the second capacitor electrode, to connect the third capacitor electrode to the first capacitor electrode at a location where the first truncated via contact is connected to the first capacitor electrode.

10. The device of claim 1, wherein the interconnect structure comprises a back-end-of-line interconnect structure of an integrated circuit chip.

11. A method, comprising:
forming an interconnect structure comprising a first metallization level and a second metallization level, wherein the first and second metallization levels comprise metal lines which form wiring of a power distribution network for distributing power supply voltage of a first polarity and power supply voltage of a second polarity, wherein the second metallization level comprises a dense region of metal lines to distribute power supply voltage of the first polarity;
forming a metal-insulator-metal capacitor between the first and second metallization levels, wherein the metal-insulator-metal capacitor comprises a first capacitor electrode, a second capacitor electrode, and a first capacitor dielectric layer disposed between the first and second capacitor electrodes;
forming a first interlevel via contact to connect a metal line of the first metallization level with a metal line of the second metallization level to distribute power supply voltage of the first polarity between the first and second metallization levels;
wherein the first interlevel via contact penetrates through the second capacitor electrode with the second capacitor electrode in contact with sidewalls of the first interlevel via contact to distribute power supply voltage of the first polarity to the second capacitor electrode; and forming a first truncated via contact to connect a metal line of the first metallization level to the first capacitor electrode in a location of the metal-insulator-metal capacitor which is overlapped by the dense region of metal lines of the second metallization level;

wherein the first truncated via contact distributes power supply voltage of the second polarity to the first capacitor electrode.

12. The method of claim 11, wherein forming the first truncated via contact comprises:

forming a via opening through the first capacitor electrode and an insulating layer down to the metal line of the first metallization layer; and filling the via opening with metallic material to form the first truncated via;

wherein the first capacitor electrode in contact with sidewalls of the first truncated via contact.

13. The method of claim 11, wherein forming the first truncated via contact comprises:

forming a via opening in an insulating layer down to the metal line of the first metallization layer;

filling the via opening with metallic material to form the first truncated via in the insulating layer;

forming the first capacitor electrode on the insulating layer in contact with a surface of the first truncated via contact.

14. The method of claim 11, further comprising forming a second truncated via contact which connects a metal line within the dense region of metal lines of the second metallization level to the second capacitor electrode, wherein the second truncated via contact distributes power supply voltage of the first polarity to the second capacitor electrode.

15. The method of claim 11, wherein the metal-insulator-metal capacitor further comprises a third capacitor electrode, and a second capacitor dielectric layer disposed between the second and third capacitor electrodes, and wherein the method further comprises forming openings in the first and third capacitor electrodes which allow the first interlevel via contact to pass through the first and third capacitor electrodes without contacting the first and third capacitor electrodes.

16. The method of claim 15, wherein forming the first truncated via contact to connect a metal line of the first metallization level to the first capacitor electrode in a location of the metal-insulator-metal capacitor which is overlapped by the dense region of metal lines of the second metallization further comprise forming the first truncated via contact to connect the metal line of the first metallization level to both the third capacitor electrode and the first capacitor electrode in the location of the metal-insulator-metal capacitor which is overlapped by the dense region of metal lines of the second metallization level, and wherein the method further comprises forming an opening in the second capacitor electrode which allows the first truncated via contact to pass through the second capacitor electrode without contacting the second capacitor electrode.

17. The method of claim 15, wherein forming the metal-insulator-metal capacitor comprises:

depositing and patterning a first layer of metallic material to form the first capacitor electrode;

depositing a first layer of dielectric material over the first capacitor electrode to form the first capacitor dielectric layer;

depositing and patterning a second layer of metallic material over the first capacitor dielectric layer to form the second capacitor electrode, wherein the second capacitor electrode comprises a patterned opening;

depositing a second layer of dielectric material over the second capacitor electrode to form the second capacitor dielectric layer;

patterning a contact opening through the first and second capacitor dielectric layers, wherein the contact opening extends through the patterned opening of the second capacitor down to the first capacitor electrode; and depositing and patterning a third layer of metallic material over the second capacitor dielectric layer to form the third capacitor electrode;

wherein the third capacitor electrode comprises a connecting portion, which extends through the patterned contact opening of the first and second dielectric layers, to connect the third capacitor electrode to the first capacitor electrode at a location where the first truncated via contact is connected to the first capacitor electrode.

18. The method of claim 15, further comprising forming a second truncated via contact, which extends through patterned openings of the first and second dielectric layers and the second capacitor electrode, to connect the third capacitor electrode to the first capacitor electrode at a location where the first truncated via contact is connected to the first capacitor electrode.

19. A device comprising:

an interconnect structure comprising a first metallization level and a second metallization level, wherein the first and second metallization levels comprise metal lines which form wiring of a power distribution network for distributing power supply voltage of a first polarity and power supply voltage of a second polarity, wherein the second metallization level comprises a dense region of metal lines to distribute power supply voltage of the first polarity;

a metal-insulator-metal capacitor disposed between the first and second metallization levels, wherein the metal-insulator-metal capacitor comprises a first capacitor electrode, a second capacitor electrode, and a first capacitor dielectric layer disposed between the first and second capacitor electrodes;

a plurality of first interlevel via contacts which connect metal lines of the first metallization level with metal lines of the second metallization level to distribute power supply voltage of the first polarity between the first and second metallization levels;

wherein the plurality of first interlevel via contacts penetrate through the second capacitor electrode at different locations of the second capacitor electrode with the second capacitor electrode in contact with sidewalls of the first interlevel via contacts to distribute power supply voltage of the first polarity across the second capacitor electrode;

a plurality of second interlevel via contacts which connect metal lines of the first metallization level with metal lines of the second metallization level to distribute power supply voltage of the second polarity between the first and second metallization levels;

wherein the plurality of second interlevel via contacts penetrate through the first capacitor electrode at different locations of the first capacitor electrode with the first capacitor electrode in contact with sidewalls of the second interlevel via contacts to distribute power supply voltage of the second polarity across the first capacitor electrode; and a plurality of first truncated via contacts which connect metal lines of the first metallization level to the first capacitor electrode at different locations of the first capacitor electrode which are overlapped by the dense region of metal lines of the second metallization level;

wherein the first truncated via contacts distribute power supply voltage of the second polarity across the first capacitor electrode.

20. The device of claim 19, wherein the metal-insulator-metal capacitor further comprises a third capacitor electrode, and a second capacitor dielectric layer disposed between the second and third capacitor electrodes, wherein the first and third capacitor electrodes comprise aligned openings which allow the first interlevel via contacts to pass through the first and third capacitor electrodes without contacting the first and third capacitor electrodes.

* * * * *